United States Patent
Odate et al.

(10) Patent No.: US 7,286,435 B2
(45) Date of Patent: Oct. 23, 2007

(54) MEMORY CARD DEVICE HAVING LOW CONSUMED POWER IN THE CONSUMED POWER STATE

(75) Inventors: Hidefumi Odate, Kodaira (JP); Atsushi Shikata, Nishitokyo (JP); Chiaki Kumahara, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 113 days.

(21) Appl. No.: 10/561,521

(22) PCT Filed: Dec. 21, 2004

(86) PCT No.: PCT/JP2004/019058

§ 371 (c)(1),
(2), (4) Date: Dec. 20, 2005

(87) PCT Pub. No.: WO2006/067833

PCT Pub. Date: Jun. 29, 2006

(65) Prior Publication Data

US 2007/0108293 A1    May 17, 2007

(51) Int. Cl.
*G11C 5/14*    (2006.01)

(52) U.S. Cl. ............ 365/227; 365/51; 365/52; 365/226

(58) Field of Classification Search ........ 365/227, 365/51, 52, 226
See application file for complete search history.

(56) References Cited

U.S. PATENT DOCUMENTS 5,490,117 A * 2/1996 Oda et al. ............ 365/226
5,828,892 A   10/1998 Mizuta ............ 395/750.01
6,434,044 B1 * 8/2002 Gongwer et al. ...... 365/185.18

FOREIGN PATENT DOCUMENTS

| JP | 2-196390 | 8/1990 |
|---|---|---|
| JP | 6-333103 | 12/1994 |
| JP | 9-231339 | 9/1997 |
| JP | 2003-345671 | 12/2003 |
| JP | 2004-64328 | 2/2004 |

* cited by examiner

*Primary Examiner*—Tuan T. Nguyen
*Assistant Examiner*—Pho M. Luu
(74) *Attorney, Agent, or Firm*—Miles & Stockbridge PC

(57) ABSTRACT

A card device has a regulator (5), a first internal circuit (6) and a second internal circuit (7), and the regulator supplies, to the second internal circuit, an internal voltage generated by dropping an external voltage (VCC) when the external voltage is high, and exactly supplies the external voltage as the internal voltage to the second internal circuit when the external voltage is low, and the external voltage is supplied as an operating power source to the first internal circuit and a transition to a low consumed power state is carried out if a command is not input for a certain period. The card device stops the operation of the regulator and suppresses the supply of the internal voltage to the second internal circuit in the transition to the low consumed power state. In the low consumed power state, consequently, it is possible to suppress a power consumption in each of the regulator and the second internal circuit in the card device.

12 Claims, 3 Drawing Sheets

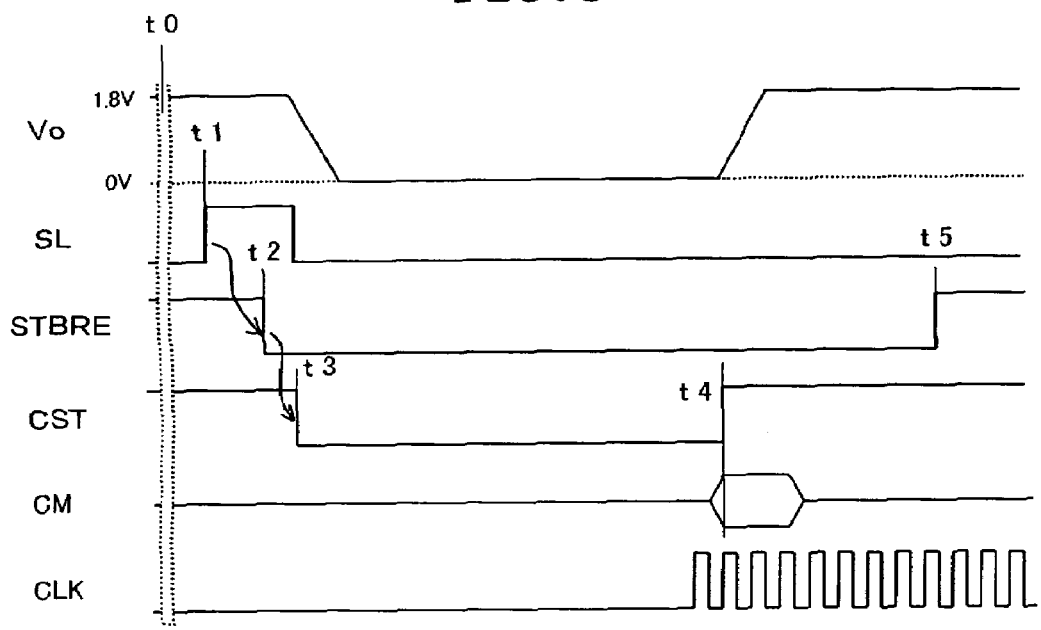
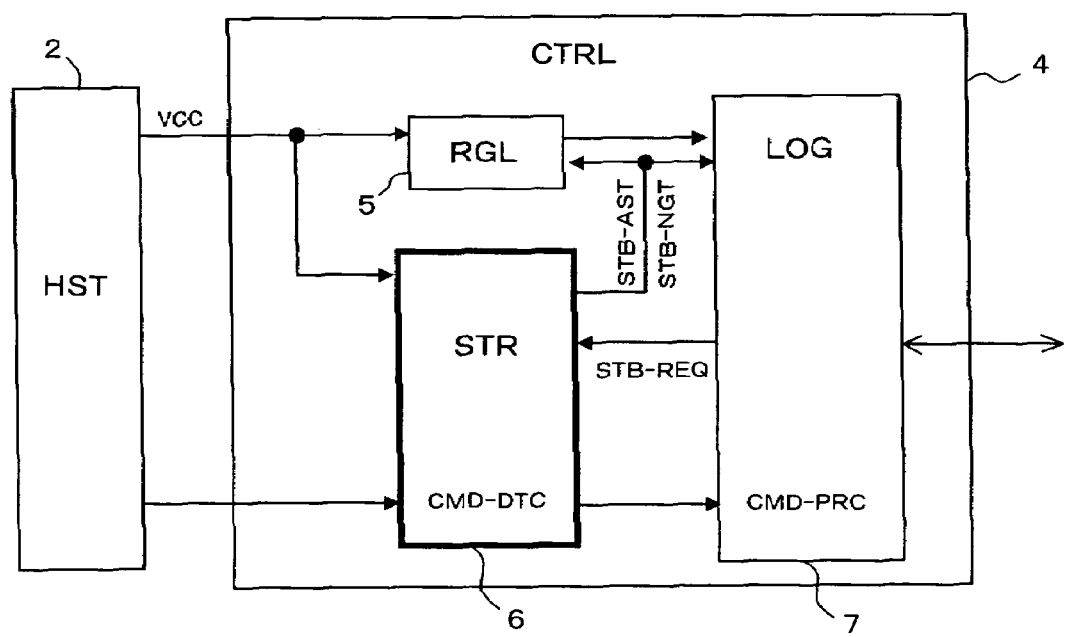

MEMORY CARD DEVICE HAVING LOW CONSUMED POWER IN THE CONSUMED POWER STATE

FIELD OF THE INVENTION

The present invention relates to an effective technique to be applied to a card device such as a memory card, an IC card or a multifunction card having a multifunction which is represented by an IC card function and a memory card function.

BACKGROUND OF THE INVENTION

Patent Document 1 (JP-A-6-333103 Publication) and Patent Document 2 (JP-A-9-231339 Publication) have described an IC card and a memory card which correspond to a dual voltage as external power sources. These have described that a voltage of 3.3V or 5V is supplied from an outside, and the voltage of 5V is dropped to 3.3V by a regulator and the voltage of 3.3V is exactly supplied to an internal circuit.

SUMMARY OF THE INVENTION

The inventor investigated a reduction in a power consumption of a card device. When a card controller of the card device does not carry out a command processing from a host, a microcomputer of the card controller is brought into a sleep state so that a consumed power in a standby mode (a low consumed power mode) can be reduced. Although the microcomputer is brought into the sleep state in the standby mode of the card device, a regulator provided in the card controller is continuously operated. Correspondingly, the power is consumed. The consumed power of a series regulator occupies most of the consumed power in the standby state. Therefore, the inventor has found that the continuous operation of the series regulator disturbs a reduction in the consumed power.

It is a typical object of the invention to reduce the consumed power in the low consumed power state of the card device.

The above and other objects and novel features of the invention will be apparent from the description of the specification and the accompanying drawings.

Brief description will be given to the summary of the typical invention disclosed in the application.

[1] A card device comprises a regulator, a first internal circuit and a second internal circuit, and the regulator supplies, to the second internal circuit, an internal voltage generated by dropping an external voltage when the external voltage is high, and exactly supplies the external voltage as an internal voltage to the second internal circuit when the external voltage is low, the external voltage is supplied as an operating power source to the first internal circuit and a transition to a low consumed power state is carried out if a command is not input for a certain period. The card device stops the operation of the regulator and suppresses the supply of the internal voltage to the second internal circuit in the transition to the low consumed power state.

Accordingly, it is possible to suppress a power consumption in each of the regulator and the second internal circuit in the card device in the low consumed power state.

As a typically specific configuration of the invention, when a return from the low consumed power state to the operation state is performed, the first internal circuit can restart the operation of the regulator to supply the internal voltage to the second internal circuit. It is sufficient that the first internal circuit is operated within at least this range. Consequently, a power consumption is very small. Since the first internal circuit is required to have a breakdown voltage for the external voltage which is high, moreover, a logical scale thereof can be expected to be usually reduced. Also in this respect, the power consumption of the first internal circuit is small.

As another typically specific configuration of the invention, the regulator has a voltage detecting circuit for deciding whether an external voltage is high or not and a reference voltage generating circuit for generating a reference voltage to be utilized when dropping the external voltage, and a stop of the operation of the regulator in the transition to the low consumed power state is set to be that of operations of the voltage detecting circuit and the reference voltage generating circuit.

As a further typically specific configuration of the invention, the second internal circuit has a microcomputer and the transition to the low consumed power state triggers a transition to a sleep state of the microcomputer.

The first internal circuit operates the regulator in response to a command input and restarts the supply of the internal voltage to the second internal circuit in the low consumed power state. The microcomputer detects the supply of the operating power source in the sleep state, thereby carrying out a power-ON reset processing.

The first internal circuit has a storage region for saving and the microcomputer saves necessary internal information for a return of an internal state in the storage region for saving in the transition to the sleep state. The microcomputer returns necessary internal information retained in the storage region for saving in the power-ON reset processing. It is possible to shorten a time required for the transition from the sleep state to the operation state.

[2] In a card device having another representation configuration, a regulator generates an internal voltage by dropping an external voltage supplied from an outside and supplies the internal voltage to an internal circuit when the external voltage is high, and exactly supplies the external voltage as the internal voltage to the internal circuit when the external voltage is low, and a transition to a low consumed power state is carried out if a command is not input for a certain period. The card device stops the operation of the regulator and stops a supply of a power to a part of the internal circuit, and exactly supplies the external voltage as the internal voltage to the other portions of the internal circuit in a transition from the operation state to the low consumed power state.

As a typically specific configuration of the invention, the part of the internal circuit in which the supply of the power is stopped in the transition from the operation state to the low consumed power state includes a microcomputer to be brought into a sleep state. The other portions of the internal circuit have a storage region for saving and the microcomputer saves necessary internal information for a return of an internal state in the storage region for saving in a transition to the sleep state. The microcomputer carries out the return of the necessary internal information retained in the storage region for saving in a power-ON reset processing.

BRIEF DESCRIPTION OF THE DRAWINGS

FIG. 3 is a operational timing chart showing a transition from an active state to a standby state and a transition from the standby state to the active state in the memory card, FIG. 5 is an explanatory diagram showing an operation of the memory card in accordance with the flowchart of FIG. 4.

DETAILED DESCRIPTION OF THE PREFERRED EMBODIMENTS

Figure 1:
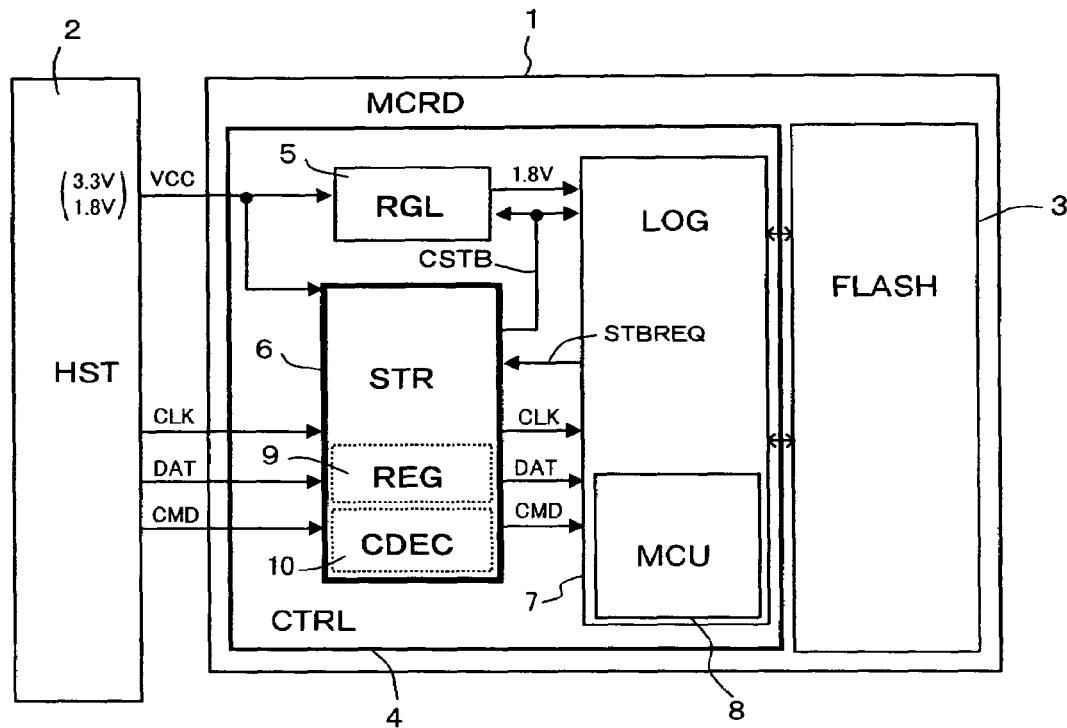
FIG. 1 is a block diagram showing a memory card according to an example of a card device.

FIG. 1 shows a memory card as an example of a card device. A memory card (MCRD) 1 shown in FIG. 1 is constituted by a non-volatile memory, for example, a flash memory (FLSH) 3 for storing data from a host (HST) 2, and a controller (CTRL) 4. The flash memory 3 has a large number of nonvolatile memory transistors for storing information depending on a difference in a threshold voltage and can electrically carry out write for raising the threshold voltage by selectively injecting an electron into an electric charge storage region of a nonvolatile memory transistor and erase for dropping the threshold voltage by selectively moving the electron in a discharging direction from the electric charge storage region, for example. The controller 4 carries out an interface control with the host 2, a hard disk compatible file memory control to the flash memory 3, and an operation mode control of the memory card 1.

The controller 4 has a regulator (RGL) 5, a starting circuit (STR) 6, and a logic portion (LOG) 7. Therein, the starting circuit (STR) 6 is set to be a first internal circuit and the logic portion (LOG) 7 is set to be a second internal circuit.

The regulator 5 may be a switching regulator or a series regulator. The switching regulator needs to have a capacitive component and a reactance component. For this reason, a circuit scale is comparatively large and a voltage generation efficiency is comparatively high. On the other hand, the series regulator is constituted by only a semiconductor unit. For this reason, the circuit scale is comparatively small and the voltage generation efficiency is comparatively low. In the series regulator, particularly, an internal leakage current is comparatively large. In a state in which the consumption of an output power is small, for example, in a standby operation, therefore, the internal leakage current is predominant over a current consumed by the regulator.

The interface control and the mode control are carried out by the starting circuit 6 and the logic portion 7. The hard disk compatible file memory control for the flash memory 2 is carried out by the logic portion 7. The logic portion 7 has a microcomputer (MCU) 8 for controlling the whole controller 4 and a logic circuit which is not shown. The starting circuit 6 has a save register (REG) 9, command data (CDEC) 10, and a logic circuit which is not shown. The starting circuit 6 inputs a clock CLK and a command CMD from the host 2 and inputs/outputs data DAT from/to the host 2. The starting circuit 6 detects the presence/absence of a command supplied from the host 2 by the command data 10. The starting circuit 6 sends a command to the logic portion 7 in a predetermined timing corresponding to an operation mode of the memory card 1, outputs the clock CLK to the logic portion 7, and furthermore, transfers data together with the logic portion 7.

When an external voltage VCC is high (for example, 3.3 V), the regulator 5 supplies an internal voltage of 1.8 V generated by dropping the external voltage VCC to the logic portion 7. When the external voltage VCC is low (for example, 1.8 V), the regulator 5 exactly supplies the external voltage as an internal voltage to the logic portion 7. The external voltage VCC is supplied as an operating power source to the starting circuit 6. Accordingly, the starting circuit 6 is constituted by a transistor having a breakdown voltage of 3.3 V and is different from the logic portion 7 constituted by a transistor having a breakdown voltage of 1.8 V.

The logic portion 7 processes a command sent from the host 2. When the command is completely processed, a new command input is waited. When detecting the case in which the command is not input for a certain period, the command decoder 10 gives an instruction for a sleep mode to the microcomputer 8 through a command. Consequently, the logic portion 7 executes a processing for carrying out a transition to the sleep mode together with the microcomputer 8. As a processing for carrying out a transition to the sleep mode, there is performed a saving operation for saving, in the register 9, an internal state of the microcomputer 8 or the other internal states of the logic portion 7. The saved internal state is utilized in a return from the sleep state into an operation state (an active state). When the processing for carrying out a transition to the sleep mode is completed, the logic portion 7 gives a standby request to the starting circuit 6 through a signal STBREQ. Consequently, the starting circuit 6 asserts a standby signal CSTB to the regulator 5 and the logic portion 7. Thus, the regulator 5 stops an operation and the supply of an internal voltage to the logic portion 7 is suppressed so that the standby state of the memory card 1 can be achieved.

The operating power source of the flash memory 3 is 3.3 V, which is not particularly restricted. When the external voltage VCC is 3.3 V, it is maintained. When the external voltage VCC is 1.8 V, it is raised by an internal charge pump circuit. It is to be confirmed that the flash memory 3 is set in a standby state when the microcomputer 8 is brought into the sleep state. In the standby state of the flash memory 3, the operation of the internal charge pump circuit is stopped or a charge pump operation frequency is reduced. In any case, a low consumed power is taken into consideration in the flash memory 3.

In the standby state, the starting circuit 6 can be still operated. When the supply of the command CMD or that of the command CMD which is synchronous with the clock CLK is detected, the standby signal CSTB to be sent to the regulator 5 and the logic portion 7 is negated. Consequently, the regulator 5 is operated so that the supply of the internal voltage to the logic portion 7 is restarted. The microcomputer 8 detects the supply of the internal voltage to start a power-ON reset processing. In the power-ON reset processing of the microcomputer 8, in the case in which significant save data are stored in the register 9, they are returned as internal state data to the microcomputer 8 or the logic portion 7. When an initialization processing in the microcomputer 8 of the logic portion 7 and the other circuit portions is completed, the memory card 1 is brought into the active state. When the active state is brought, the starting circuit 6 supplies, to the logic portion 7, a command sent immediately before a transition to the active state and can restart the command processing of the logic portion 7.

Figure 2:
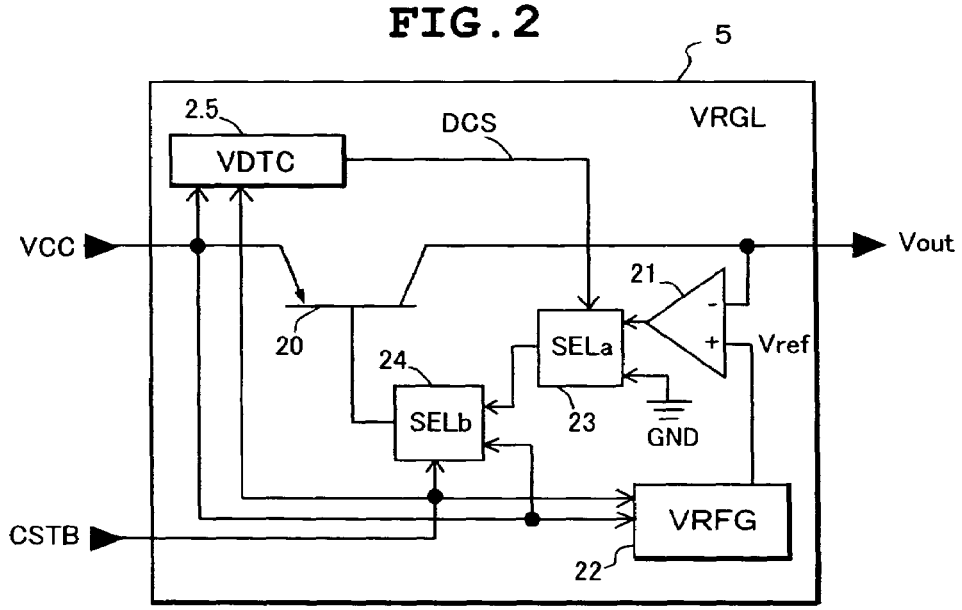
FIG. 2 is a circuit diagram illustrating a structure of a regulator.

FIG. 2 shows a structure of the series regulator as an example of the structure of the regulator 5. The regulator 5 has a PNP transistor 20, an operational amplifier 21, a reference voltage generating circuit (VRFG) 22, a selector (SELa) 23, a selector (SELb) 24 and a voltage detecting circuit (VDTC) 25.

The voltage detecting circuit 25 decides whether the external voltage VCC is a high voltage, for example, 3.3 V or a low voltage, for example, 1.8 V and outputs a decision signal DCS. The external voltage VCC is supplied to an emitter of the PNP transistor 20 and an internal voltage Vout is output from a collector. The collector of the PNP transistor 20 is connected to an inverted input terminal (−) of the operational amplifier 21 and a reference voltage Vref is applied to a non-inverted input terminal (+). The reference voltage Vref is generated in the reference voltage generating circuit 22. The reference voltage generating circuit 22 generates the reference voltage Vref based on a difference in a threshold voltage between a p-channel type MOS transistor and an n-channel type MOS transistor, which is not particularly restricted. The reference voltage Vref is set to be 1.8 V, for example. The selector 23 selects an output of the operational amplifier 21 or a ground voltage GND (or a common potential) of the circuit and outputs the same in accordance with the decision signal DCS. The ground potential GND or the common potential in the circuit is connected to a supply voltage ground to which the memory card and the host are connected. When the decision signal DCS implies a high voltage input, the output of the operational amplifier 21 is selected. When the decision signal DCS implies a low voltage input, the ground voltage GND is selected. The output of the operational amplifier 21 is connected to a base of the PNP transistor 20 through the selector 24 so that a conductance of the PNP transistor 20 is negative feedback controlled and an operation for dropping the external voltage VCC is carried out so that an internal voltage Vout dropped to 1.8 V is obtained. On the other hand, when the ground voltage GND is selected to the base of the PNP transistor 20 through the selector 24, the dropping operation of the PNP transistor 20 is not carried out so that the external voltage VCC of 1.8 V is exactly output as the internal voltage Vout. The selector 24 outputs the output of the selector 23 or the external voltage VCC in accordance with the standby signal CSTB. When the active mode is designated by the negation of the standby signal CSTB, the selector 24 selects the output of the selector 23 in the former stage and the dropping operation is controlled in response to the detection signal DCS as described above. On the other hand, when the standby mode is designated by the assertion of the standby signal CSTB, the selector 24 selects the external power source VCC. Consequently, the PNP transistor 20 is cut off so that the supply of the internal voltage Vout to the logic portion 7 is suppressed. In the logic portion 7, thus, the supply of a power is cut off so that all of the operations are stopped. Furthermore, an instruction for the standby mode is given to the voltage detecting circuit 25 and the reference voltage generating circuit 22 by the assertion of the standby signal CSTB, thereby stopping the operation. Consequently, the operation of the regulator 5 is also stopped and the power consumption of the regulator 5 is also eliminated in the standby state.

FIG. 3 shows an operation timing indicating a transition from the active state to the standby state and a transition from the standby state to the active state in the memory card.

The logic portion 7 processes a command sent from the host 2. When the command is completely processed (t0), a new command input is waited. When detecting the case in which the microcomputer 8 completes the command processing and the command decoder 10 has no command input for a certain period, the logic portion 7 gives an instruction for a sleep mode to the microcomputer 8 through a signal SLP. Consequently, the logic portion 7 executes a processing for carrying out a transition to the sleep mode together with the microcomputer 8. As a processing for carrying out a transition to the sleep mode, there is performed a saving operation for saving, in the register 9, an internal state of the microcomputer 8 or internal states of the other parts in the logic portion. When the processing for carrying out a transition to the sleep mode is completed, the logic portion 7 gives a standby request to the starting circuit 6 through a signal STBREQ (t2). Consequently, the starting circuit 6 asserts the standby signal CSTB to the regulator 5 and the logic portion 7 (t3) Thus, the regulator 5 stops an operation and the supply of an internal voltage to the logic portion 7 is suppressed so that the standby state of the memory card 1 can be achieved. In the standby state, the starting circuit 6 can be still operated. When the supply of the command CMD which is synchronous with the clock CLK is detected, the standby signal CSTB to be sent to the regulator 5 and the logic portion 7 is negated (t4). Consequently, the regulator 5 is operated so that the supply of the internal voltage to the logic portion 7 is restarted. The microcomputer 8 detects the supply of the internal voltage to start a power-ON reset processing. In the power-ON reset processing of the microcomputer 8, in the case in which significant save data are stored in the register 9, they are returned as internal state data to the microcomputer 8 or the logic portion 7. When an initialization processing in the microcomputer 8 of the logic portion 7 and the other circuit portions is completed, the memory card 1 is brought into the active state so that the signal STBREQ is negated (t5). When the active state is brought, the starting circuit 6 supplies, to the logic portion 7, a command sent immediately before a transition to the active state and can restart the command processing of the logic portion 7.

Figure 4:
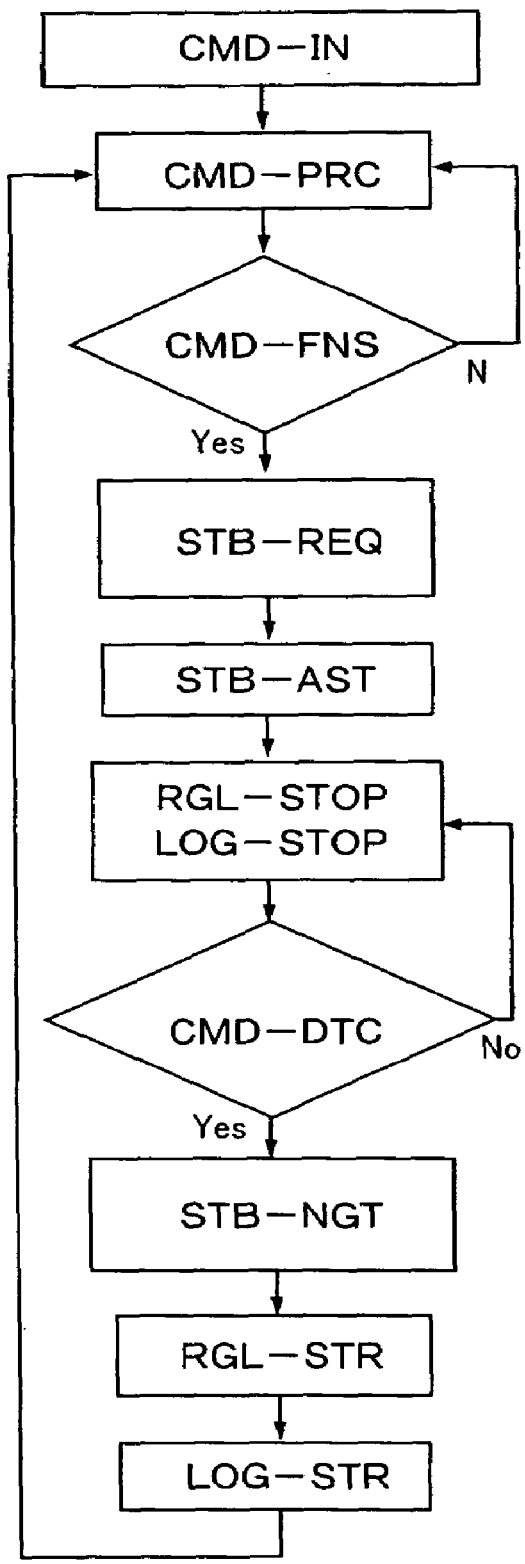
FIG. 4 is a flowchart showing the transition from the active state to the standby state and the transition from the standby state to the active state in the memory card.

FIG. 4 is a flowchart showing the transition from the active state to the standby state and the transition from the standby state to the active state in the memory card. FIG. 5 shows an operation of the memory card in accordance with the flowchart of FIG. 4.

When a command is input from the host 2 (CMD-IN), the logic portion 7 starts the command processing (CMD-PRC). When the completion of the command processing is waited (CMD-FNS) and the command decoder 10 detects the case in which a command is not input for a certain period, the logic portion 7 gives an instruction for the sleep mode to the microcomputer 8. Consequently, the logic portion 7 executes a processing for carrying out a transition to the sleep mode together with the microcomputer 8. When completing the processing for carrying out a transition to the sleep mode, the logic portion 7 gives a standby request to the starting circuit 6 through the signal STBREQ (STR-REQ). Consequently, the starting circuit 6 asserts the standby signal CSTB to the regulator 5 and the logic portion 7 (STB-AST). Consequently, the operation of the regulator 5 is stopped (REG-STOP), and furthermore, the supply of the internal voltage to the logic portion 7 is suppressed so that the operation is stopped (LOG-STOP). Thus, the standby state of the memory card 1 can be achieved. The starting operation 6 can be still operated in the standby state. When the supply of the command CMD which is synchronous with the clock CLK is detected (CMD-DTC), the standby signal CSTB to be sent to the regulator 5 and the logic portion 7 is negated (STB-NGT). At this time, the starting circuit 6 may transmit a response to the command CMD to the host before the completion of the starting operation together with the regulator 5 and the logic portion 7. Consequently, the regulator 5 is operated (REG-STR) and the operation of the logic portion 7 is started (LOG-STR) so that a command processing (CMD-PRC) can be carried out.

The memory card described above has the following functions and advantages.

[1] When carrying out the transition to the standby state, the memory card 1 stops the operation of the regulator 5 and suppresses the supply of the internal voltage to the logic portion 7. In the standby state, accordingly, it is possible to suppress the power consumption in each of the regulator 5 and the logic portion 7 of the memory card 1.

[2] The starting circuit 6 has the register 9 to be a storage region for saving and the microcomputer 8 saves necessary internal information for the return of the internal state in the register 9 in the transition to the sleep state. When the standby state is released, therefore, the microcomputer 8 can return an internal state set immediately before the standby by using the internal information retained in the register 9 in the power-ON reset processing. Accordingly, it is possible to shorten a time required for the transition from the sleep state to the operation state.

While the invention made by the inventor has been specifically described based on the embodiment, it is apparent that the invention is not restricted but various changes can be made without departing from the scope thereof.

For example, the structure of the regulator is not restricted to that in FIG. 2 but can be properly changed. The external voltage is not restricted to 3.3 V and the drop voltage is not restricted to 1.8 V but various changes can be properly made.

While the memory card 1 detects that a command is not input from an outside for a certain period of time and gives the instruction for the sleep mode to the microcomputer 8, moreover, the logic portion 7 may give the instruction for the sleep mode to the microcomputer 8 in response to a command designating the transition to the sleep state which is sent from the outside and may give the standby request to the starting circuit 6 through the signal STBREQ.

Furthermore, the invention can also be applied to a flash memory in addition to the controller of the memory card. While the controller detects that a command is not input from the host for a certain period and carries out the transition to the low consumed power state, it is sufficient that the flash memory detects that an access is not given from the controller for a certain period and carries out the transition to the low consumed power state, thereby stopping the operations of the regulator and the charge pump therein.

The invention is not restricted to a memory card such as a flash memory card but can widely be applied to an IC card mounting a microcomputer for an IC card and a multifunction card mounting a microcomputer for an IC card, a controller for a memory card and a nonvolatile memory.

What is claimed is:

1. A card device having a normal operation state and a low consumed power state as an operation state and serving to carry out a transition from the normal operation state to the low consumed power state if a command is not input for a certain period, comprising a regulator, a first internal circuit and a second internal circuit, wherein the regulator supplies, to the second internal circuit, an internal voltage generated by dropping an external voltage when the external voltage is high, and exactly supplies the external voltage as an internal voltage to the second internal circuit when the external voltage is low, the external voltage is supplied as an operating power source to the first internal circuit and the supply of the external voltage to be the operating power source is continuously carried out also after the transition to the low consumed power state, and when the operation state of the card device carries out the transition to the low consumed power state, an operation of the regulator is stopped and the supply of the internal voltage to be supplied to the second internal circuit by the regulator is suppressed.

2. The card device according to claim 1, wherein when a return from the low consumed power state to the operation state is performed, the first internal circuit can restart the operation of the regulator to supply the internal voltage to the second internal circuit.

3. The card device according to claim 2, wherein the regulator has a voltage detecting circuit for deciding whether an external voltage is high or not and a reference voltage generating circuit for generating a reference voltage to be utilized when dropping the external voltage, and a stop of the operation of the regulator in the transmission to the low consumed power state is set to be that of operations of the voltage detecting circuit and the reference voltage generating circuit.

4. The card device according to claim 1, wherein the second internal circuit has a microcomputer and the transition to the low consumed power state triggers a transition to a sleep state of the microcomputer.

5. The card device according to claim 4, wherein the first internal circuit operates the regulator in response to a command input and restarts the supply of the internal voltage to the second internal circuit in a low consumed power state.

6. The card device according to claim 5, wherein the microcomputer detects the supply of the operating power source in the sleep state, thereby carrying out a power-ON reset processing.

7. The card device according to claim 6, wherein the first internal circuit has a storage region for saving and the microcomputer saves necessary internal information for a return of an internal state in the storage region for saving in the transition to the sleep state.

8. The card device according to claim 7, wherein the microcomputer returns necessary internal information retained in the storage region for saving in the power-ON reset processing.

9. A card device having a normal operation state and a low consumed power state as an operation state and serving to carry out a transition from the normal operation state to the low consumed power state if a command is not input for a certain period of time, wherein a regulator generates an internal voltage by dropping an external voltage supplied from an outside and supplies the internal voltage to an internal circuit when the external voltage is high, and exactly supplies the external voltage as the internal voltage to the internal circuit when the external voltage is low, and an operation of the regulator is stopped, a supply of a power to a part of the internal circuit is stopped and the external voltage is exactly supplied as the internal voltage to the other portions of the internal circuit in a transition from the operation state to the low consumed power state.

10. The card device according to claim 9, wherein the part of the internal circuit in which the supply of the power is stopped in the transition from the normal operation state to the low consumed power state includes a microcomputer to be brought into a sleep state.

11. The card device according to claim 10, wherein the other portions of the internal circuit have a storage region for saving and the microcomputer saves necessary internal information for a return of an internal state in the storage region for saving in a transition to the sleep state.

12. The card device according to claim 11, wherein the microcomputer carries out the return of the necessary internal information retained in the storage region for saving in a power-ON reset processing.

* * * * *